United States Patent
Kihara et al.

(10) Patent No.: US 10,504,745 B2
(45) Date of Patent: Dec. 10, 2019

(54) METHOD FOR PROCESSING TARGET OBJECT

(71) Applicant: TOKYO ELECTRON LIMITED, Tokyo (JP)

(72) Inventors: Yoshihide Kihara, Miyagi (JP); Toru Hisamatsu, Miyagi (JP); Masanobu Honda, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/135,178

(22) Filed: Sep. 19, 2018

(65) Prior Publication Data
US 2019/0019689 A1 Jan. 17, 2019

Related U.S. Application Data

(63) Continuation-in-part of application No. PCT/JP2017/019024, filed on May 22, 2017.

(30) Foreign Application Priority Data

May 25, 2016 (JP) .................................. 2016-104414

(51) Int. Cl.
*H01L 21/00* (2006.01)
*H01L 21/311* (2006.01)
(Continued)

(52) U.S. Cl.
CPC .... *H01L 21/31144* (2013.01); *H01L 21/0337* (2013.01); *H01L 21/3065* (2013.01);
(Continued)

(58) Field of Classification Search
CPC . H01L 21/31144; H01L 22/20; H01L 21/324; H01L 21/0337; H01L 22/12; H01L 21/31; H01L 21/3065
(Continued)

(56) References Cited

U.S. PATENT DOCUMENTS

| 6,667,139 B2* | 12/2003 | Fujisawa | ............. G03F 7/70558 |
| | | | 430/30 |
| 7,510,341 B2* | 3/2009 | Hayasaki | .................. G03F 7/40 |
| | | | 355/27 |

(Continued)

FOREIGN PATENT DOCUMENTS

JP 2004-080033 A 3/2004

OTHER PUBLICATIONS

International Search Report dated Aug. 15, 2017 in PCT/JP2017/019024 (2 pages).

*Primary Examiner* — Vu A Vu
(74) *Attorney, Agent, or Firm* — Rothwell, Figg, Ernst & Manbeck, P.C.

(57) ABSTRACT

In a method according to an embodiment, before etching a target layer of a wafer, a main surface of the target layer is divided into a plurality of areas. A difference value between a groove width of a mask and a reference value of the groove width is calculated for each of the plurality of areas, a temperature of the target layer is adjusted by using correspondence data indicating correspondence between a temperature of the target layer and a film thickness of a formed film. Then, a film is formed on the mask for each atom layer, and a film having a film thickness corresponding to the difference value is formed on the mask to correct the groove width in each of the plurality of areas to the reference value.

15 Claims, 10 Drawing Sheets

(51) Int. Cl.
*H01L 21/3065* (2006.01)
*H01L 21/31* (2006.01)
*H01L 21/033* (2006.01)
*H01L 21/324* (2006.01)
*H01L 21/66* (2006.01)

(52) U.S. Cl.
CPC ............ *H01L 21/31* (2013.01); *H01L 21/324* (2013.01); *H01L 22/12* (2013.01); *H01L 22/20* (2013.01)

(58) Field of Classification Search
USPC .......................................................... 438/5
See application file for complete search history.

(56) References Cited

U.S. PATENT DOCUMENTS

| | | | | |
|---|---|---|---|---|
| 7,625,680 | B2* | 12/2009 | Lee | G01N 21/4788 219/448.11 |
| 7,883,824 | B2* | 2/2011 | Asano | G03F 7/70641 430/30 |
| 7,960,078 | B2* | 6/2011 | Sawai | G03F 7/70641 382/145 |
| 2006/0094131 | A1* | 5/2006 | Wang | G03F 7/70558 438/14 |
| 2011/0320030 | A1* | 12/2011 | Riordon | H01J 37/3171 700/121 |
| 2016/0099131 | A1* | 4/2016 | Kihara | H01J 37/3244 216/41 |

\* cited by examiner

METHOD FOR PROCESSING TARGET OBJECT

CROSS-REFERENCE TO RELATED APPLICATIONS

This application is a Continuation-in-part of International Application No. PCT/JP2017/019024, filed on May 22, 2017, which claims priority from Japanese Patent Application No. 2016-104414, filed on May 25, 2016, all of which are incorporated herein in their entireties by reference, and priority is claimed to each of the foregoing.

TECHNICAL FIELD

An embodiment of the present disclosure relates to a method for processing a target object.

BACKGROUND

In a manufacturing process of an electronic device such as a semiconductor device, a mask is formed on a target layer, and etching is performed for transferring a pattern of the mask to the target layer. As the mask, a resist mask is generally used. The resist mask is formed by a photolithography technology. Accordingly, a critical dimension of a pattern formed on a layer to be etched is influenced by, for example, a resolution limit of the resist mask formed by the photolithography technology and a pattern density. However, recently, with the high integration of electronic devices, it is required to form a pattern having dimensions smaller than the resolution limit of the resist mask. Therefore, as described in Japanese Patent Application Laid-Open No. 2004-080033, there has been suggested a technology for decreasing a width of an opening provided by a resist mask by forming a silicon oxide film on the resist mask and adjusting the dimensions of the resist mask.

In a method of forming a micro-pattern disclosed in Japanese Patent Application Laid-Open No. 2004-080033, a photoresist pattern is formed on a material film on which a micro pattern is to be formed, and then a silicon oxide film is deposited on the material film, but the silicon oxide film needs to be conformally thinly formed without damaging the photoresist pattern thereunder. Then, dry etching is also performed on a lower film, but at an initial stage, a spacer is formed on a lateral wall of the photoresist pattern and subsequently a polymer film is formed on the photoresist pattern.

SUMMARY

In an aspect, a method for processing a target object is provided. The method includes: a first step of adjusting a width of a mask pattern of a mask provided on a main surface of a target layer included in the target object, the main surface being divided into a plurality of areas; and a second step of etching the target layer by using the mask after the first step. The first step includes: a third step of measuring the width of the mask pattern for each of the plurality of areas of the main surface, a fourth step of calculating a positive difference value obtained by subtracting a reference value of the width of the mask pattern from the width of the mask pattern measured in the third step for each of the plurality of areas of the main surface after the third step; and a fifth step of forming a film having a thickness of the positive difference value of each of the plurality of areas of the main surface calculated in the fourth step on a surface of the mask of the target object introduced into a processing container of a plasma processing device after the fourth step. The fifth step includes: a sixth step of supplying first gas into the processing container; a seventh step of purging an inside of the processing container after the sixth step; an eighth step of generating plasma of second gas within the processing container after the seventh step; a ninth step of purging the inside of the processing container after the eighth step; and repeating the sixth step to ninth step thereby forming a film on a surface of the mask. In the fifth step, a temperature of the target layer of the target object introduced into the processing container is adjusted for each of the plurality of areas by using pre-acquired correspondence data indicating correspondence between a temperature of the target layer and a film thickness of a film deposited on the surface of the mask on the target layer, and a film thickness corresponding to the difference value calculated for each of the plurality of areas in the fourth step; and a processing time required in the sixth step falls within a time period during which the film thickness of the film deposited on the surface of the mask on the target layer increases or decreases according to a temperature of the target layer in the sixth step.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 8:
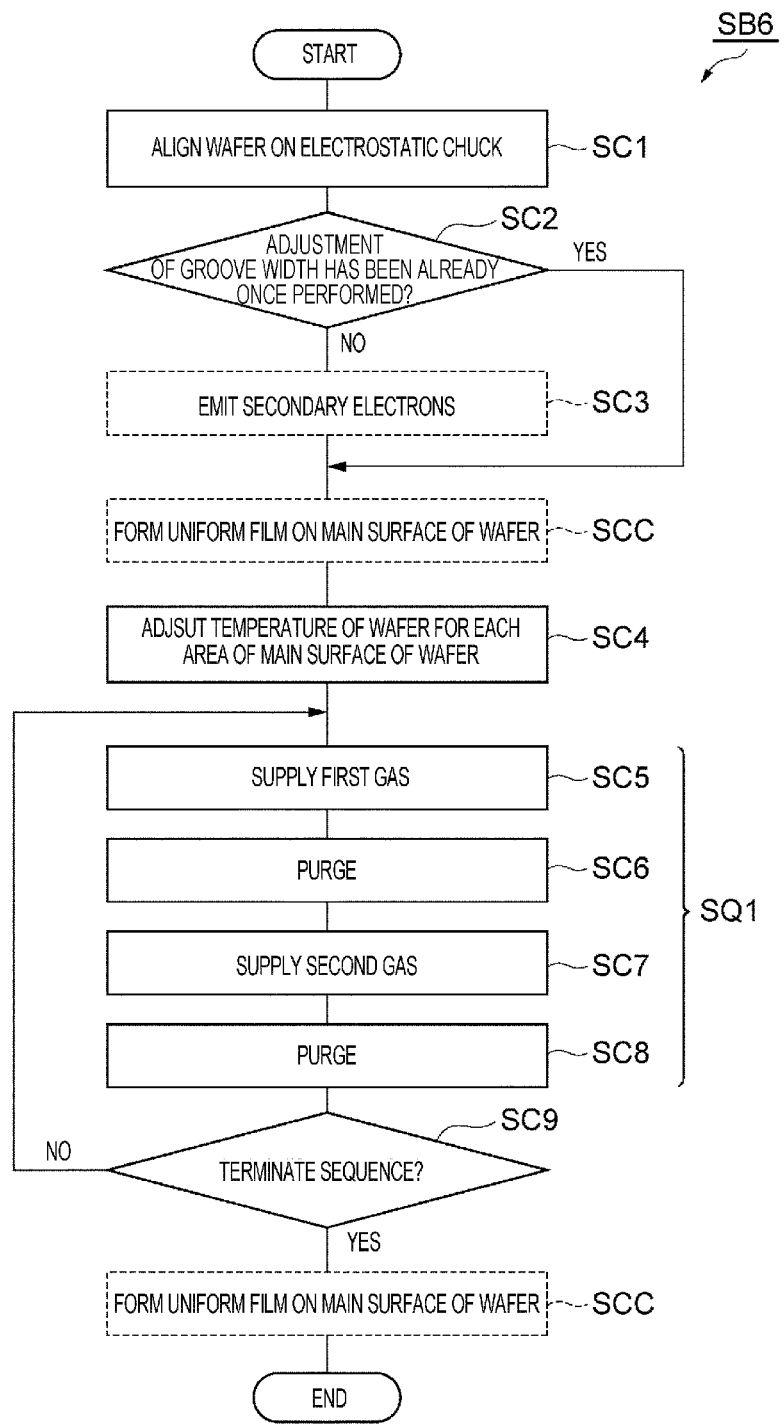
FIG. 8 is a flowchart illustrating an example of a step of adjusting a groove width of a pattern, which is a part of the steps illustrated in FIG. 5.
Figure 9:
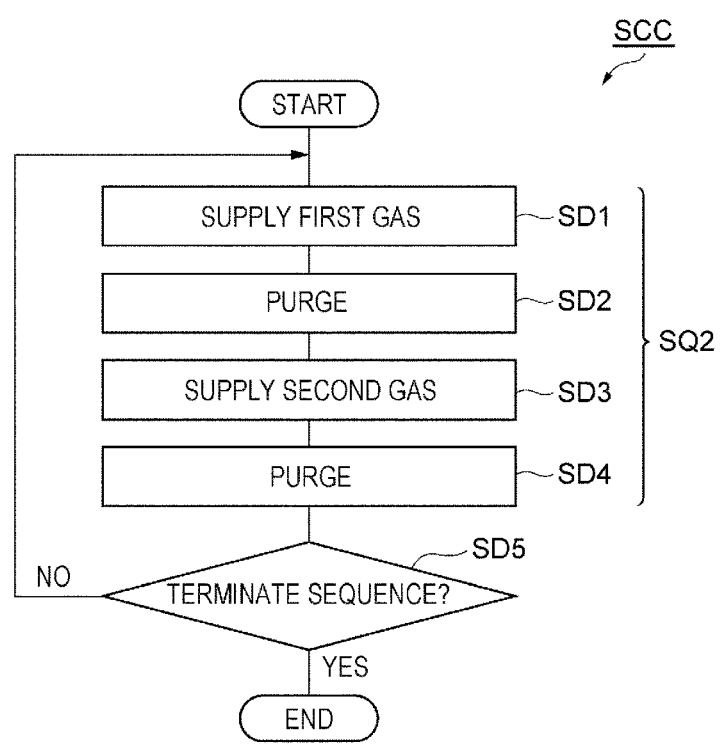
FIG. 9 is a flowchart illustrating an example of a step of forming a uniform film on a main surface of the target object, which may be included in the steps illustrated in FIG. 8.

10C is a diagram schematically illustrating a state of the target object after the sequence illustrated in each of FIGS. 8 and 9 is executed.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

When a pattern having a smaller value than a resolution limit of a resist mask is formed, there is a demand for very precisely controlling a critical dimension (CD) of a groove of the pattern. When the pattern is elaborate, an influence by a variation in the critical dimension is increased. Accordingly, in forming a pattern on an target object, there is a need for implementing a method of suppressing a variation in the highly precise critical dimension in order to achieve the miniaturization with high integration.

In an aspect, a method for processing a target object is provided. The method includes: a first step of adjusting a width of a mask pattern of a mask provided on a main surface of a target layer included in the target object, the main surface being divided into a plurality of areas; and a second step of etching the target layer by using the mask after the first step. The first step includes: a third step of measuring the width of the mask pattern for each of the plurality of areas of the main surface, a fourth step of calculating a positive difference value obtained by subtracting a reference value of the width of the mask pattern from the width of the mask pattern measured in the third step for each of the plurality of areas of the main surface after the third step; and a fifth step of forming a film having a thickness of the positive difference value of each of the plurality of areas of the main surface calculated in the fourth step on a surface of the mask of the target object introduced into a processing container of a plasma processing device after the fourth step. The fifth step includes: a sixth step of supplying first gas into the processing container; a seventh step of purging an inside of the processing container after the sixth step; an eighth step of generating plasma of second gas within the processing container after the seventh step; a ninth step of purging the inside of the processing container after the eighth step; and repeating the sixth step to ninth step thereby forming a film on a surface of the mask. In the fifth step, a temperature of the target layer of the target object introduced into the processing container is adjusted for each of the plurality of areas by using pre-acquired correspondence data indicating correspondence between a temperature of the target layer and a film thickness of a film deposited on the surface of the mask on the target layer, and a film thickness corresponding to the difference value calculated for each of the plurality of areas in the fourth step; and a processing time required in the sixth step falls within a time period during which the film thickness of the film deposited on the surface of the mask on the target layer increases or decreases according to a temperature of the target layer in the sixth step.

In the method, before the second step of etching the target layer, the first step of adjusting the width of the mask pattern of the mask is performed. In the first step, the main surface of the target layer is divided into a plurality of areas, in the third and fourth steps, a difference value between the width of the mask pattern and the reference value of the width is calculated for each of the plurality of areas, and in the fifth step, a film having a film thickness corresponding to the difference value is formed on the mask and the width of the mask pattern in each of the plurality of areas is corrected to the reference value. In the fifth step, the film is very precisely formed in each atom layer on the mask by the same method as an atomic layer deposition (ALD) method by using the film forming processing in which the sixth step to the ninth step are repeatedly executed. Since the film thickness of the film formed by the film forming processing is different according to a temperature of the target layer, in the tenth step, the temperature of the target layer is adjusted so that the temperature of the target layer becomes a temperature required for forming a film having the film thickness corresponding to the difference value calculated in the fourth step for each of the plurality of areas by using correspondence data indicating correspondence between a temperature of the target layer and a film thickness of a formed film. As described above, before the etching performed in the second step, a film thickness corresponding to a correction amount of the mask pattern is determined for each of the plurality of areas of the main surface of the target layer, a temperature of the target layer required for forming the film thickness is determined by using the correspondence data, and the same film forming processing as the ALD method is performed in the state where the temperature of the target layer is adjusted to the temperature determined for each of the plurality of areas, so that the variation of the pattern of the mask may be precisely and sufficiently suppressed for each of the plurality of areas of the main surface of the target layer.

In an embodiment, the temperature of the target layer is adjusted based on the correspondence data for each of the plurality of areas such that a temperature of each of the plurality of areas in the target layer of the target object introduced into the processing container becomes a temperature corresponding to a film thickness of the difference value calculated for each of the plurality of areas in the fourth step.

In an embodiment, in the fifth step the film on the surface of the mask is conformally formed regardless of the plurality of areas, the temperature of the target layer is adjusted based on the correspondence data for each of the plurality of areas such that a temperature of each of the plurality of areas in the target layer of the target object introduced into the processing container becomes a temperature corresponding to a value obtained by subtracting a film thickness of the film conformally formed from a film thickness of the difference value calculated for each of the plurality of areas, and adjusting the temperature of the layer based on the correspondence data for each of the plurality of areas is performed before adjusting the temperature of the layer using the pre-acquired correspondence data or after the film forming processing. As described above, for a common film thickness among the film thicknesses of the plural areas, it is possible to partially form the film without adjusting a temperature of the target layer performed on each of the plurality of areas.

In an embodiment, the first step includes re-executing the third step and the fourth step after execution of the fifth step, and re-executing the fifth step when the re-execution of the third step and the fourth step does not cause a difference value calculated in the fourth step to satisfy a preset reference range. As described above, after the film is formed by the fifth step, a difference value of the width of the mask pattern is calculated again, it is determined whether the difference value is within a reference range, and the forming of the film is performed again when the difference value is not within the reference range, so that the variation of the width of the mask pattern may be further sufficiently suppressed.

In an embodiment, the first gas may include an aminosilane-based gas, and the second gas may include a gas containing oxygen atoms and carbon atoms.

In an embodiment, aminosilane-based gas of the first gas may include aminosilane having one to three silicon atoms. The aminosilane-based gas of the first gas may include aminosilane having one to three amino groups. As described above, as the aminosilane-based gas of the first gas, aminosilane having one to three silicon atoms may be used. Further, as the aminosilane-based gas of the first gas, aminosilane having one to three amino groups may be used.

In another aspect, a method for processing a target object is provided. The method includes: measuring a width of a mask pattern of a mask provided on a surface of a target layer included in a target object for each of a plurality of areas formed on the surface of the target layer; calculating a positive difference value obtained by substracting a predetermined reference value from the measured width of the mask pattern for each of the plurality of areas; adjusting a temperature of the target layer for each of the plurality of areas such that a film having a film thickness corresponding to the difference value is formed by using pre-acquired correspondence data indicating correspondence between a temperature of the target layer and a film thickness of a film deposited on the surface of the mask on the target layer, and the difference value calculated for each of the plurality of areas; and forming a film having the film thickness of the difference value for each of the plurality of areas on the surface of the mask of the target object by using an atomic layer deposition, after the adjusting.

In the embodiment, the forming may be performed by repeatedly executing a sequence including: supplying a first gas into a processing container; purging an inside of the processing container; and generating plasma of a second gas within the processing container.

In the embodiment, a time for supplying the first gas may fall within a time period during which the film thickness of the film deposited on the surface of the mask increases or decreases according to an increase or decrease in temperature of the target layer.

In the embodiment, the method further includes: measuring a width of the mask pattern of the mask formed with the film after the forming for each of the plurality of areas; and determining whether or not re-adjustment of the width is required.

In the embodiment, the method further includes: etching the target layer using the mask having a pattern width adjusted by the forming.

In the embodiment, the adjusting of the temperature, the forming, and the etching are performed in a processing container without unloading the target object.

In yet another aspect, a method for processing a target object is provided. The method includes: a first step of adjusting a width of a pattern of a first mask provided on a surface of a first film of a target layer of a target object; a second step of etching the first film using the first mask after the first step to form a second mask; a third step of adjusting a width of a pattern of the second mask; and a fouth step of etching the target layer using the second mask the width of which is adjusted. The first step includes: measuring the width of the pattern of the first mask for each of a plurality of areas formed in the first film; calculating a positive difference value obtained by substracting a predetermined reference width from the measured value of the width for each of the plurality of areas; adjusting a temperature of the target layer for each of the plurality of areas such that a film having a film thickness corresponding to the difference value is formed by using pre-acquired correspondence data indicating correspondence between a temperature of the target layer and a film thickness of a film deposited on the surface of the mask on the target layer, and the difference value calculated for each of the plurality of areas; and forming a film having the film thickness of the difference value for each of the plurality of areas on the surface of the mask of the target object by using an atomic layer deposition, after the adjusting. The third step includes: measuring the width of the pattern of the second mask for each of a plurality of areas; calculating a positive difference value obtained by subtracting a predetermined reference width from the measured value of the width for each of the plurality of areas; adjusting a temperature of the target layer for each of the plurality of areas such that a film having a film thickness corresponding to the difference value is formed by using pre-acquired correspondence data indicating correspondence between a temperature of the target layer and a film thickness of a film deposited on the surface of the second mask on the target layer, and the difference value calculated for each of the plurality of areas; and forming a film having the film thickness of the difference value for each of the plurality of areas on the surface of the mask of the target object by using an atomic layer deposition, after the adjusting.

As described above, there is provided the method of suppressing a variation in a highly precise critical dimension in forming a pattern on an target object.

Hereinafter, various embodiments will be described in detail with reference to the drawings. Further, in each drawing, the same reference numeral is given to the same or similar parts.

Figure 1:
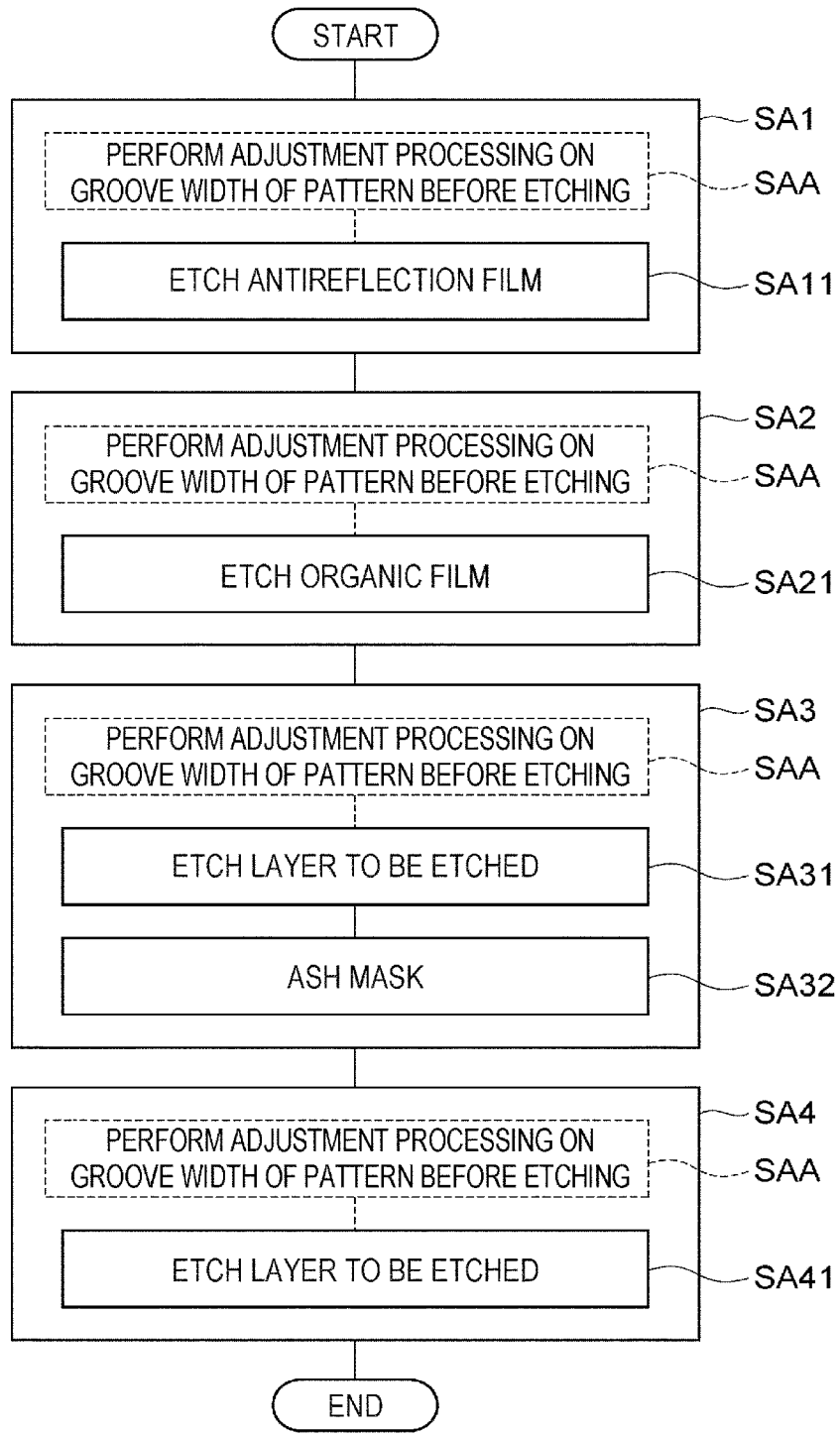
FIG. 1 is a flowchart illustrating a method for processing a target object according to an embodiment.
Figure 2:
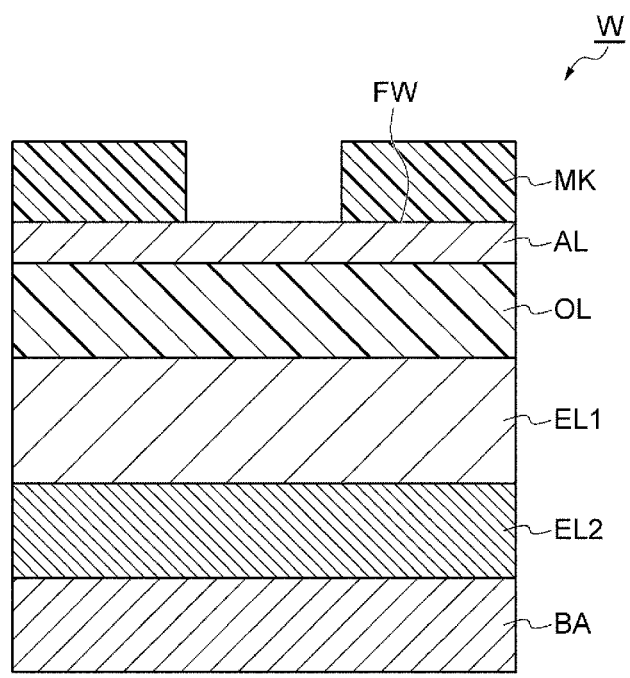
FIG. 2 is a cross-sectional view illustrating a target object to which the method illustrated in FIG. 1 is applied.

FIG. 1 is a flowchart illustrating a method for processing a target object according to an embodiment. Method MT illustrated in FIG. 1 is an embodiment of a method for processing a target object. FIG. 2 is a cross-sectional view illustrating a target object (hereinafter, referred to as a wafer W), which is a target of application of method MT illustrated in FIG. 1. A wafer W illustrated in FIG. 2 includes a substrate BA, a layer to be etched EL2, a layer to be etched EL1 an organic film OL, an antireflection film AL, and a mask MK.

The layer to be etched EL2 is provided on the substrate BA. The layer to be etched EL1 is provided on the layer to be etched EL2. The layer to be etched EL1 and the layer to be etched EL2 are layers containing silicon, and for example, amorphous silicon layers or polycrystalline silicon layers. The organic film OL is a film formed of an organic material and is provided on the layer to be etched EL1. The antireflection film AL is an antireflection film containing Si, and is provided on the organic film OL. The mask MK is provided on the antireflection film AL and on a main surface FW of the wafer W. The mask MK is a mask formed of an organic material, and for example, a resist mask. A pattern providing an opening is formed in the mask MK by photolithography.

Figure 3:
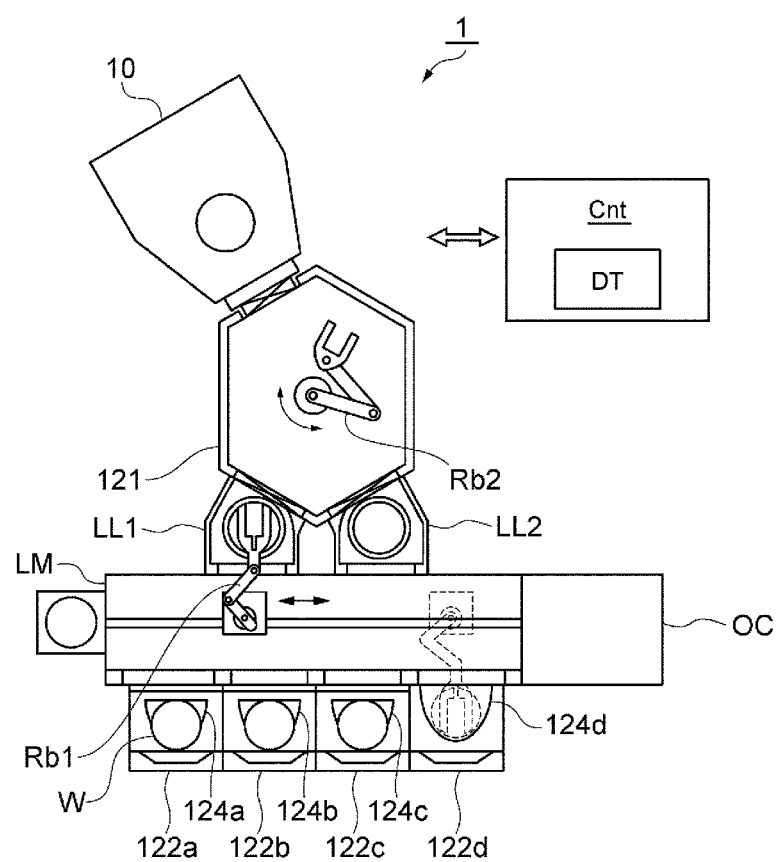
FIG. 3 is a diagram illustrating an example of a processing system, which is usable for carrying out the method illustrated in FIG. 1.

Method MT (the method for processing the target object) is executed by a processing system including a plasma processing device. FIG. 3 is a diagram illustrating an example of a processing system, which is usable for carrying out method MT illustrated in FIG. 1. The processing system 1 illustrated in FIG. 3 includes a control unit Cnt, a table 122a, a table 122b, a table 122c, and a table 122d, an accommodating container 124a, an accommodating container 124b, an accommodating container 124c, and an accommodating container 124d, a loader module LM, a load lock chamber LL1, a load lock chamber LL2, a transfer chamber 121, ad a plasma processing apparatus 10.

The control unit Cnt is a computer including a processor, a storage unit, an input device, and a display device, and controls each unit of the processing system 1, which will be described below. The control unit Cnt is connected to a transport robot Rb1, a transport robot Rb2, an optical observation device OC, and the plasma processing apparatus 10. Further, in the plasma processing apparatus 10 illustrated in FIG. 4, which will be described below, the control unit Cnt is connected to a valve group 42, a flow rate controller group 44, an exhaust device 50, a first high frequency power supply 62, a matcher 66, a second high frequency power supply 64, a matcher 68, a power supply 70, a heater power supply HP, and a chiller unit.

The control unit Cnt is operated according to a computer program (a program based on an input recipe) for controlling each unit of the processing system 1 in each step of method MT and transmits a control signal. Each unit, for example, the transport robots Rb1 and Rb2, the optical observation device OC, and the plasma processing apparatus 10 of the processing system 1 is controlled by the control signal from the control unit Cnt. In the plasma processing apparatus 10 illustrated in FIG. 4, by the control signal from the control unit Cnt, it is possible to control a selection and a flow rate of gas supplied from the gas source group 40, the exhaust of the exhaust device 50, supply of power from the first high frequency power supply 62 and the second high frequency power supply 64, application of a voltage from the power supply 70, supply of power from the heater power supply HP, and a coolant flow rate and a coolant temperature from the chiller unit. Further, each step of method MT for processing the target object disclosed in the present specification may be executed by operating each unit of the processing system 1 under the control of the control unit Cnt. In the storage unit of the control unit Cnt, a computer program for executing method MT and various data (for example, corresponding data DT to be described below) used for executing method MT are stored to be readable.

The tables 122a to 122d are arranged along an edge of the loader module LM. The accommodating containers 124a to 124d are provided in the tables 122a to 122d, respectively. The wafers W may be accommodated in the accommodating containers 124a to 124d.

The transport robot Rb1 is provided inside the loader module LM. The transport robot Rb1 takes out the wafer W accommodated in any one of the accommodating containers 124a to 124d and transports the wafer W to the load lock chamber LL1 or LL2.

The load lock chamber LL1 and LL2 are provided along another edge of the loader module LM and connected to the loader module LM. The load lock chambers LL1 and LL2 constitute a preliminary depression chamber. Each of the load lock chambers LL1 and LL2 is connected to the transfer chamber 121.

The transfer chamber 121 is a chamber, which is capable of decompressing pressure, and the transport robot Rb2 is provided inside the transfer chamber 121. The plasma processing apparatus 10 is connected to the transfer chamber 121. The transport robot Rb2 take outs the wafer W from the load lock chamber LL1 or the load lock chamber LL2 and transports the wafer W to the plasma processing apparatus 10.

The processing system 1 includes the optical observation device OC. The wafer W may be shifted between the optical observation device OC and the plasma processing apparatus 10 by the transport robot Rb1 and the transport robot Rb2. The wafer W is accommodated in the optical observation device OC by the transport robot Rb1, and after the wafer W is aligned in the optical observation device OC, the optical observation device OC measures a groove width of a pattern of the mask (for example, the mask MK) of the wafer W and transmits a measurement result to the control unit Cnt. In the optical observation device OC, the groove width of the pattern of the mask may be measured for each of the plurality of areas ER (to be described below) of the main surface FW.

Figure 4:
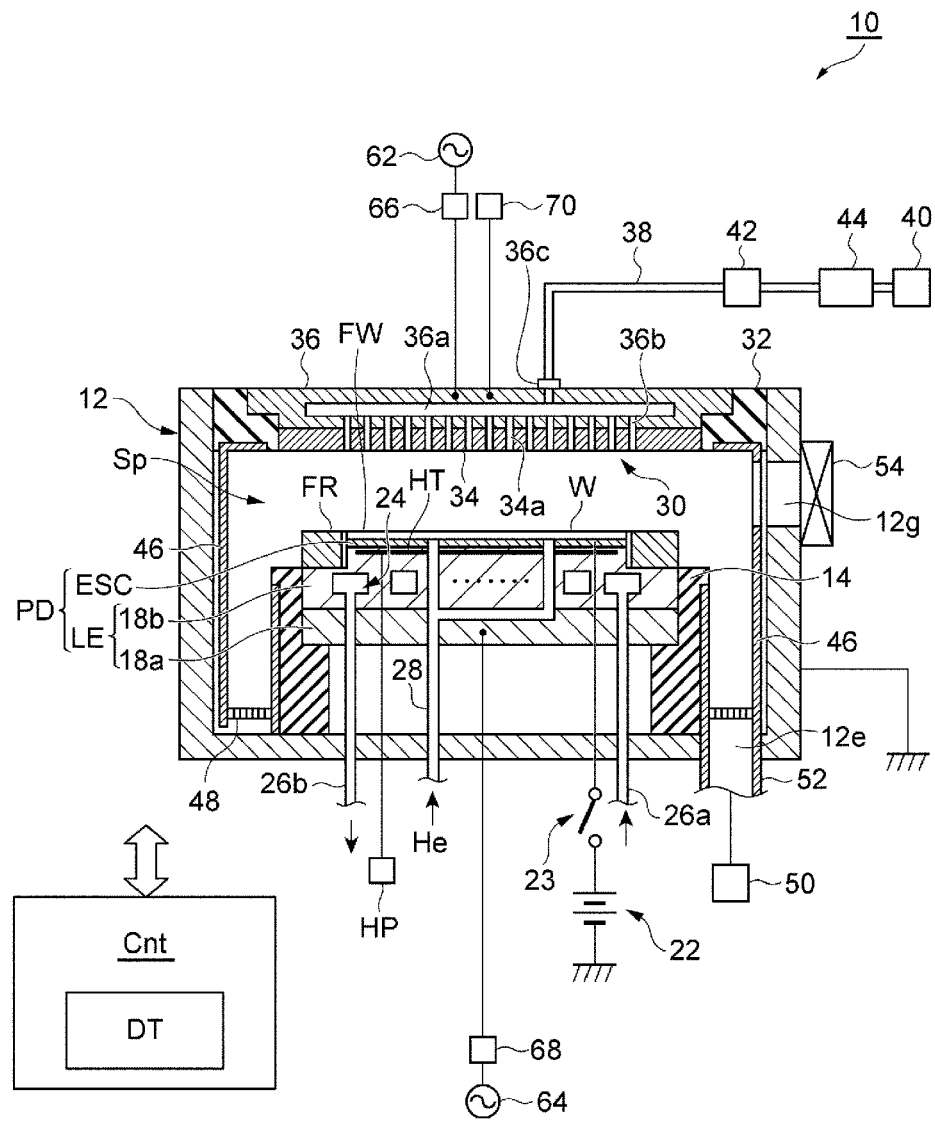
FIG. 4 is a diagram illustrating an example of a plasma processing device, which may include the processing system illustrated in FIG. 3.

FIG. 4 is a diagram illustrating an example of the plasma processing device, which may include the processing system illustrated in FIG. 3. FIG. 4 schematically illustrates a cross-section structure of the plasma processing apparatus 10 usable in various embodiments of method MT for processing the target object.

As illustrated in FIG. 4, the plasma processing apparatus 10 is a plasma etching device including a parallel flat electrode, and includes the processing container 12. The processing container 12 approximately has a cylindrical shape and defines a processing space Sp. The processing container 12 is formed of, for example, aluminum, and an inner wall surface thereof is subjected to an anodizing treatment. The processing container 12 is protected and grounded.

A support part 14 approximately having a cylindrical shape is provided on a bottom of the processing container 12. The support part 14 is formed of, for example, an insulating material. The insulating material forming the support part 14 may include oxygen, like quartz. The support part 14 is extended from the bottom of the processing container 12 in a vertical direction within the processing container 12. A mounting table PD is provided within the processing container 12. The mounting table PD is supported by the support part 14.

The mounting table PD holds the wafer W on an upper surface of the mounting table PD. The main surface FW of the wafer W is on the opposite side of a back surface of the wafer W, which is in contact with the upper surface of the mounting table PD, and faces an upper electrode 30. The mounting table PD includes a lower electrode LE and an electrostatic chuck ESC. The lower electrode LE includes a first plate 18a and a second plate 18b. The first plate 18a and the second plate 18b are formed of, for example, metal, such as aluminum, and approximately have a disk shape. The second plate 18b is provided on the first plate 18a, and is electrically connected with the first plate 18a.

The electrostatic chuck ESC is provided on the second plate 18b. The electrostatic chuck ESC has a structure, in which an electrode that is a conductive film is disposed between a pair of insulating layers or a pair of insulating sheets. A DC power supply 22 is electrically connected to an electrode of the electrostatic chuck ESC through a switch 23. When the wafer W is disposed on the mounting table PD, the wafer W is in contact with the electrostatic chuck ESC. The back surface (the surface opposite to the main surface FW) of the wafer W is in contact with the electrostatic chuck ESC. The electrostatic chuck ESC adsorbs the wafer W by an electrostatic force such as a Coulomb force generated by a DC voltage from the DC power supply 22. Accordingly, the electrostatic chuck ESC may hold the wafer W.

A focus ring FR is provided on a peripheral portion of the second plate 18b so as to surround the edge of the wafer W and the electrostatic chuck ESC. The focus ring FR is provided for improving uniformity of etching. The focus ring FR is formed of a material appropriately selected by a material of a film to be etched, and may be formed of, for example, quartz.

A coolant flow path 24 is provided inside the second plate 18b. The coolant flow path 24 constitutes a temperature control mechanism. Coolant is supplied to the coolant flow path 24 through a pipe 26a from a chiller unit (not illustrated) provided outside the processing container 12. The coolant supplied to the coolant flow path 24 returns to the chiller unit through a pipe 26b. As described above, the coolant is supplied so as to circulate the coolant flow path 24. By controlling a temperature of the coolant, a temperature of the wafer W supported by the electrostatic chuck ESC may be controlled.

A gas supply line 28 is provided to the plasma processing apparatus 10. The gas supply line 28 supplies a heat transfer gas, for example, He gas from a heat transfer gas supply mechanism to a section between an upper surface of the electrostatic chuck ESC and the back surface of the wafer W.

A temperature adjusting unit HT for controlling a temperature of the wafer W is provided in the plasma processing apparatus 10. The temperature adjusting unit HT is embedded in the electrostatic chuck ESC. The heater power supply HP is connected to the temperature adjusting unit HT. Power is supplied to the temperature adjusting unit HT from the heater power supply HP, so that a temperature of the electrostatic chuck ESC is adjusted and a temperature of the wafer W arranged on the electrostatic chuck ESC is adjusted. Further, the temperature adjusting unit HT may also be embedded in the second plate 18b.

The temperature adjusting unit HT includes a plurality of heating elements emitting heat, and a plurality of temperature sensors each configured to detect a temperature in the vicinity of the plurality of heating elements. When the wafer W is aligned on the electrostatic chuck ESC, each of the plurality of heating elements is arranged in each of the plurality of areas ER (to be described below) of the main surface FW of the wafer W. When the wafer W is aligned and arranged on the electrostatic chuck ESC, the control unit Cnt recognizes the heating element and the temperature sensor corresponding to each of the plurality of areas ER of the main surface FW of the wafer W in association with the area ER. The control unit Cnt may distinguish the area ER, and the heating element and the temperature sensor corresponding to the area ER by, a number, such as a figure or a character, for each of the plurality of areas (for each of the plurality of areas ER). The control unit Cnt detects a temperature of one area ER by the temperature sensor provided at a position corresponding to the one area ER, and controls a temperature of the one area ER by the heating element provided at the position corresponding to the one area ER. Further, the temperature detected by one temperature sensor when the wafer W is arranged on the electrostatic chuck ESC is the same as a temperature of the area ER on the temperature sensor in the wafer W (more particularly, a temperature of the area ER in a target layer J1 which is to be described below).

The plasma processing apparatus 10 includes the upper electrode 30. The upper electrode 30 is arranged to face the mounting table PD above the mounting table PD. The lower electrode LE and the upper electrode 30 are provided substantially parallel to each other, and constitute a parallel flat electrode. The processing space Sp for performing the plasma processing on the wafer W is provided between the upper electrode 30 and the lower electrode LE.

The upper electrode 30 is supported on an upper part of the processing container 12 through an insulating shielding member 32. The insulating shielding member 32 is formed of an insulating material, and may include, for example, oxygen, like quartz. The upper electrode 30 may include an electrode plate 34 and an electrode support body 36. The electrode plate 34 faces the processing space Sp, and a plurality of gas discharge holes 34a is provided to the electrode plate 34. In an embodiment, the electrode plate 34 contains silicon. In a separate embodiment, the electrode plate 34 may contain a silicon oxide.

The electrode support body 36 supports the electrode plate 34 to be detachable, and may be formed of a conductive material, for example, aluminum. The electrode support body 36 may have a water cooling structure. A gas diffusion chamber 36a is provided inside the electrode support body 36. A plurality of gas flow holes 36b communicating with the gas discharge holes 34a is extended downward from the gas diffusion chamber 36a. A gas inlet 36c guiding a processing gas to the gas diffusion chamber 36a is formed in the electrode support body 36, and a gas supply pipe 38 is connected to the gas inlet 36c.

A gas source group 40 is connected to the gas supply pipe 38 through a valve group 42 and a flow rate controller group 44. The gas source group 40 includes a plurality of gas sources. The plurality of gas sources may include a source of organic group-containing aminosilane-based gas, a source of fluorocarbon-based gas ($C_xF_y$ gas (x and y are integers of 1 to 10) a source of gas having oxygen atoms and carbon atoms (for example, carbon dioxide gas), a source of nitrogen gas, a source of hydrogen gas, and a source of noble gas. As the aminosilane-based gas, gas having a molecular structure with a relatively small number of amino groups may be used, and for example, monoaminosilane ($H_3$—Si—R (R is an amino group, which may include an organic group and may be substituted) may be used. The aminosilane-based gas (gas included in first gas G1 which is to be described below) may include aminosilane, which may have one to three silicon atoms, or may include aminosilane having one to three amino groups. The aminosilane having one to three silicon atoms may be monosilane (monoaminosilane) having one to three amino groups, disilane having one to three amino groups, or trisilane having one to three amino groups. Further, the aminosilane may have an amino group which may be substituted. Further, the amino group may be substituted by any one of a methyl group, an ethyl group, a propyl group, and a butyl group. Further, the methyl group, the ethyl group, the propyl group, or the butyl group may be substituted by halogen. As the fluorocarbon-based gas, predetermined fluorocarbon-based gas, such as $CF_4$ gas, $C_4F_6$ gas, and $C_4F_8$ gas, may be used. As the noble gas, predetermined noble gas, such as Ar gas and He gas, may be used.

The valve group 42 includes a plurality of valves, and the flow rate controller group 44 includes a plurality of flow rate controllers, such as a mass flow controller. Each of the plurality of gas sources of the gas source group 40 is connected to the gas supply pipe 38 through a corresponding valve of the valve group 42 and a corresponding flow rate controller of the flow rate controller group 44. Accordingly, the plasma processing apparatus 10 may supply the gas from the one or more gas sources selected from the plurality of gas sources of the gas source group 40 into the processing container 12 with a separately controlled flow rate.

In the plasma processing apparatus 10, a deposit shield 46 is detachably provided along an inner wall of the processing container 12. The deposit shield 46 is also provided on an outer periphery of the support part 14. The deposit shield 46 prevents etching by-products (deposits) from being deposited in the processing container 12, and may be formed by coating an aluminum material with ceramics, such as $Y_2O_3$. The deposit shield may be formed of a material, for example, quartz, including oxygen, in addition to $Y_2O_3$.

An exhaust plate 48 is provided at the bottom side of the processing container 12, that is, a space between the support part 14 and the lateral wall of the processing container 12. The exhaust plate 48 may be formed by coating an aluminum material with ceramics, such as $Y_2O_3$. An exhaust port 12e is provided in the processing container 12 which is a lower side of the exhaust plate 48. The exhaust device 50 is connected to the exhaust port 12e through an exhaust pipe 52. The exhaust device 50 includes a vacuum pump, such as a turbo molecular pump, and may decompress a space within the processing container 12 to a desired vacuum level. A loading and unloading port 12g of the wafer W is provided on the lateral wall of the processing container 12, and the loading and unloading port 12g may be opened and closed by a gate valve 54.

The plasma processing apparatus 10 further includes the first high frequency power supply 62 and the second high frequency power supply 64. The first high frequency power supply 62 is a power supply generating first high frequency power for generating plasma, and generates high frequency power at a frequency of 27 to 100 MHz, for example, 60 MHz. Further, the first high frequency power supply 62 has a pulse specification, and may be controlled at a frequency of 5 to 10 kHz and a duty of 50 to 100%. The first high frequency power supply 62 is connected to the upper electrode 30 through the matcher 66. The matcher 66 is a circuit for matching output impedance of the first high frequency power supply 62 and input impedance at a load side (the lower electrode (LE) side). Further, the high frequency power supply 62 may be connected to the lower electrode LE through the matcher 66.

The second high frequency power supply 64 is a power supply for generating second high frequency power for drawing ions to the wafer W, that is, high frequency bias power, and generates high frequency bias power at a frequency within a range of 400 kHz to 40.68 MHz, for example, a frequency of 13.56 MHz. Further, the second high frequency power supply 64 has a pulse specification and may be controlled at a frequency of 5 to 40 kHz and a duty of 20 to 100%. The second high frequency power supply 64 is connected to the lower electrode LE through the matcher 68. The matcher 68 is a circuit for matching output impedance of the second high frequency power supply 64 and input impedance at the load side (the lower electrode (LE) side).

The plasma processing apparatus 10 further includes the power supply 70. The power supply 70 is connected to the upper electrode 30. The power supply 70 applies a voltage for drawing positive ions present within the processing space Sp into the electrode plate 34 to the upper electrode 30. In the example, the power supply 70 is a DC power supply generating a negative DC voltage. When the voltage is applied to the upper electrode 30 from the power supply 70, the positive ions present in the processing space Sp collide with the electrode plate 34. Accordingly, secondary electrons and/or silicon are discharged from the electrode plate 34.

Method MT will be described hereinafter in detail based on an embodiment carried out in the processing system 1 including the plasma processing apparatus 10 as an example with reference to FIGS. 1, 5, 8, and 9. Further, method MT may be carried out in a processing system different from the processing system 1, and the processing system may include a plasma processing device, other than the plasma processing apparatus 10.

First, method MT illustrated in FIG. 1 includes steps SA1 to SA4. Step SA1 includes step SA11 (the second step) of etching the antireflection film AL by using the mask MK illustrated in FIG. 2. Step SA2 subsequent to step SA1 includes step SA21 (the second step) of etching the organic film OL by using the mask formed of the antireflection film AL by the etching performed in step SA11. Step SA3 subsequent to step SA2 includes step SA31 of etching the layer to be etched EL1 by using the mask formed of the organic film OL by the etching performed in step SA21, and step SA32 of removing the mask by ashing the mask formed of the organic film OL after step SA31. Step SA4 subsequent to step SA3 includes step SA41 of etching the layer to be etched EL2 by using the mask formed of the layer to be etched EL1 by the etching performed in step SA31.

In step SA11, the antireflection film AL is etched. Particularly, a processing gas containing fluorocarbon gas is supplied into the processing container 12 from the gas source selected from the plurality of gas sources of the gas source group 40. Further, high-frequency power is supplied from the first high frequency power supply 62. High-frequency bias power is supplied from the second high frequency power supply 64. A pressure inside the processing container 12 is set to a predetermined pressure by operating the exhaust device 50. Through the foregoing steps, plasma of the fluorocarbon gas is generated within the processing space Sp of the processing container 12. An active species including fluorine in the generated plasma etches a region exposed from the mask MK out of the entire region of the antireflection film A. By the etching of the antireflection film AL, the mask used for etching the organic film OL is formed from the antireflection film AL.

In step SA21, the organic film OL is etched. Particularly, a processing gas containing nitrogen gas and hydrogen gas is supplied to the processing container 12 from the gas source selected from the plurality of gas sources of the gas source group 40. Further, high-frequency power is supplied from the first high frequency power supply 62. High frequency bias power is supplied from the second high frequency power supply 64. The pressure inside the processing container 12 is set to a predetermined pressure by operating the exhaust device 50. Through the foregoing steps, plasma of the processing gas containing nitrogen gas and hydrogen gas is generated in the processing space Sp of the processing container 12. Hydrogen radical, which is an active species of hydrogen in the generated plasma etches the region exposed from the mask formed of the antireflection film AL in step SA11 out of the entire region of the organic film OL. By the etching of the organic film OL, a mask used for etching the layer to be etched EL1 is formed of the organic film OL. Further, as gas for etching the organic film OL, a processing gas containing oxygen may be used.

Step SA31 of step SA3 subsequent to step SA2, the layer to be etched EL1 is etched. Particularly, a processing gas is supplied to the processing container 12 from the gas source selected from the plurality of gas sources of the gas source group 40. The processing gas may be appropriately selected depending on a material forming the layer to be etched EL1. For example, the layer to be etched EL1 is formed of a silicon oxide, the processing gas may include fluorocarbon gas. Further, high-frequency power is supplied from the first high frequency power supply 62. High frequency bias power is supplied from the second high frequency power supply 64.

The pressure inside the processing container 12 is set to a predetermined pressure by operating the exhaust device 50. Through the steps, plasma is generated. The active species in the generated plasma etches the region exposed from the mask formed of the organic film OL by the etching performed in step SA21 out of the entire region of the layer to be etched EL1. After step SA31, in step SA32, the mask formed of the organic film OL in step SA21 is ashed. Particularly, a processing gas is supplied to the processing container 12 from the gas source selected from the plurality of gas sources of the gas source group. The processing gas may include oxygen gas and oxygen atoms. Further, high frequency power is supplied from the first high frequency power supply 62. High frequency bias power is supplied from the second high frequency power supply 64. The pressure inside the processing container 12 is set to a predetermined pressure by operating the exhaust device 50. Through the steps, plasma is generated. The active species in the generated plasma ashes the mask formed of the organic film OL in step SA21. Further, as gas for ashing the mask formed of the organic film OL in step SA21, a processing gas containing nitrogen gas and hydrogen gas may be used.

In step SA41 of step SA4 subsequent to step SA3, the layer to be etched EL2 is etched. Particularly, a processing gas is supplied to the processing container 12 from the gas source selected from the plurality of gas sources of the gas source group 40. The processing gas may be appropriately selected depending on a material forming the layer to be etched EL2. For example, when the layer to be etched EL2 is formed of amorphous silicon, the processing gas may include halogen-based gas. Further, high frequency power is supplied from the first high frequency power supply 62. High frequency bias power is supplied from the second high frequency power supply 64. The pressure inside the processing container 12 is set to a predetermined pressure by operating the exhaust device 50. Through the steps, plasma is generated. The active species in the generated plasma etches the region exposed from the mask formed of the layer to be etched EL1 by the etching and ashing performed in steps SA31 and SA32 out of the entire region of the layer to be etched EL2.

Steps SA1, SA2, SA3, and SA4 may include step SAA (the first step) of adjusting a groove width of the pattern before the etching. In step SAA, before the etching, a groove width of the pattern of the mask used in the etching is adjusted. When step SAA is performed in step SA1, step SAA is performed before step SA11. When step SAA is performed in step SA2, step SAA is performed before step SA21. When step SAA is performed in step SA3, step SAA is performed before step SA31. When step SAA is performed in step SA4, step SAA is performed before step SA41.

Figure 5:
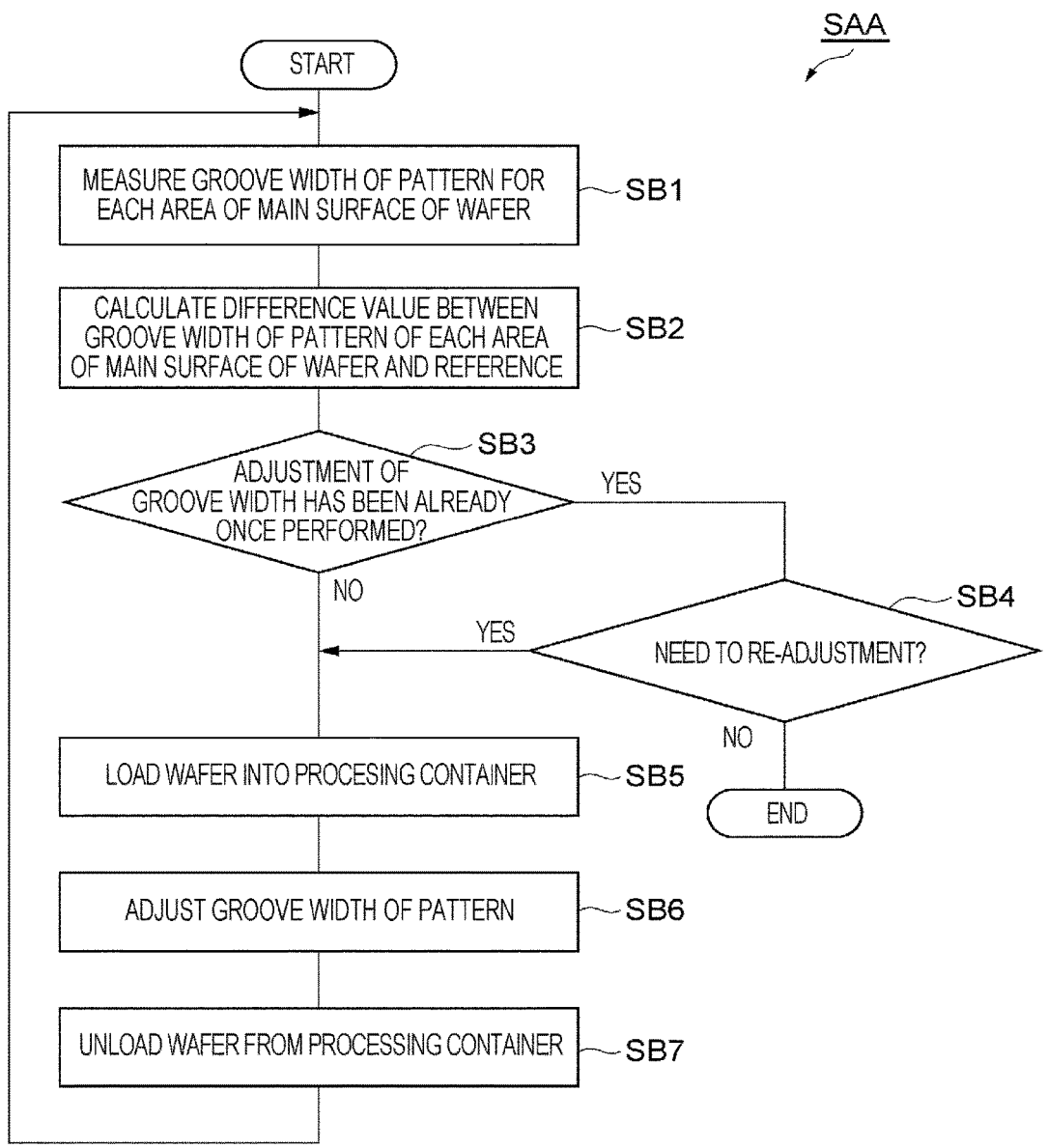
FIG. 5 is a flowchart illustrating an example of a step of adjusting a groove width of a pattern before etching, which is a step that may be included in the method illustrated in FIG. 1.
Figure 6A:
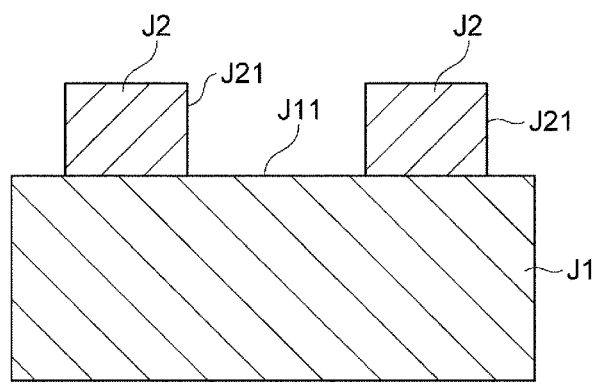
FIG. 6A is a cross-sectional view illustrating a state of an target object before the steps illustrated in FIG. 5 is performed.
Figure 6B:
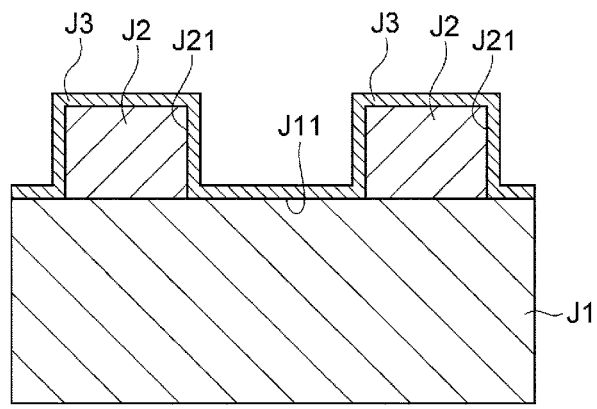
FIG. 6B is a cross-sectional view illustrating a state of the target object after the steps illustrated in FIG. 5 is performed.

A state of a wafer W, which is a processing target of step SAA (that is, a processing target of the step illustrated in FIG. 5 to be described below) is illustrated in FIG. 6A. FIG. 6B is a cross-sectional view illustrating a state of the wafer W before the step illustrated in FIG. 5 (step SAA) is performed. The wafer W illustrated in FIG. 6A includes a target layer J1 and a mask J2. The mask J2 is provided on a main surface J11 of the target layer J1 (when the mask J2 corresponds to a mask MK, the main surface J11 corresponds to a main surface FW of the wafer W).

When step SAA illustrated in FIG. 1 is executed in step SA1 of etching the antireflection film AL, the target layer J1 is the antireflection film AL and the mask J2 is the mask MK. In step SA11, after step SAA is executed, the target layer J1 is etched by using the mask, on which the processing of adjusting the groove width is performed.

When step SAA illustrated in FIG. 1 is executed in step SA2 of etching the organic film OL, the target layer J1 is the organic film OL, and the mask J2 is the mask formed of the antireflection film AL by the etching performed in step SA11. In step SA21, after step SAA is executed, the target layer J1 is etched by using the mask, on which the processing of adjusting the groove width is performed.

When step SAA illustrated in FIG. 1 is executed in step SA3 of etching the layer to be etched EL1 the target layer J1 is the layer to be etched EL1 and the mask J2 is the mask formed of the organic film OL by the etching performed in step SA21. In step SA31, after step SAA is executed, the target layer J1 is etched by using the mask, on which the processing of adjusting the groove width is performed.

When step SAA illustrated in FIG. 1 is executed in step SA4 of etching the layer to be etched EL2, the target layer J1 is the layer to be etched EL2, and the mask J2 is the mask formed of the layer to be etched EL1 by the etching and the ashing performed in steps SA31 and SA32. In step SA41, after step SAA is executed, the target layer J1 is etched by using the mask, on which the processing of adjusting the groove width is performed.

Next, step SAA illustrated in FIG. 1 will be described in detail with reference to FIG. 5. FIG. 5 is a flowchart illustrating an example of the step of adjusting a groove width of a pattern before etching, which is a step (step SAA) may be included in the method illustrated in FIG. 1.

Figure 7:
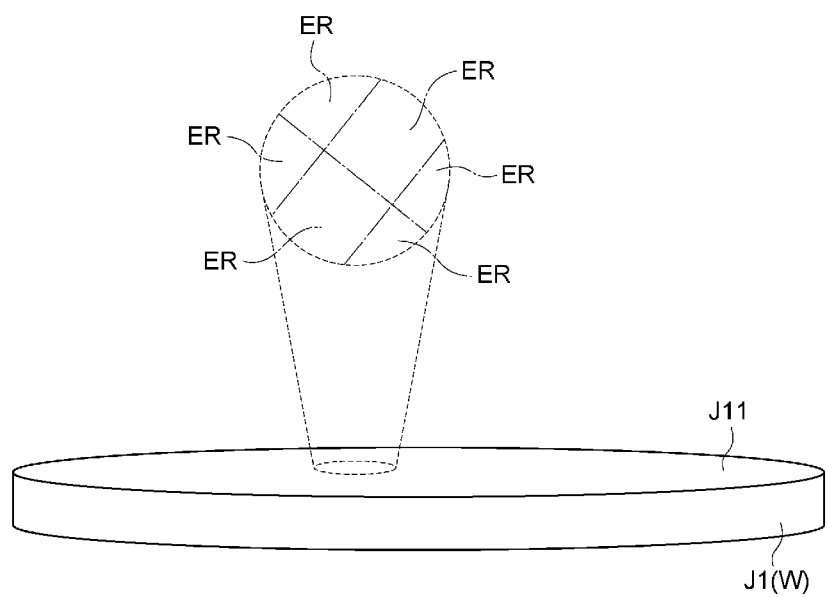
FIG. 7 is a diagram schematically illustrating some of a plurality of divided areas of a main surface of a target object in the method for processing a target object according to an embodiment as an example.

In step SAA (in the processing performed by the control unit Cnt), the main surface J11 of the target layer J1 of the wafer W is divided into the plurality of areas ER. FIG. 7 is a diagram schematically illustrating some of a plurality of divided areas ER of the main surface of the target layer J1 of the wafer W in method MT according to an embodiment as an example. The plurality of areas ER does not overlap. The main surface J11 of the target layer J1 (the main surface FW of the wafer W) is coated with the plurality of areas ER. A shape of the area ER is, for example, a shape of an area concentrically extended based on a center point of the main surface J11 (a center point of the main surface FW) of the target layer J1, or an area in a lattice shape, but is not limited thereto.

As illustrated in FIG. 5, step SAA includes steps SB1 to SB7, and steps SB5 to SB7 may be executed a plurality of times (repeatedly) according to determination results of steps SB3 and SB4. First, in step SB1 (the third step), a value of a groove width of the pattern of the mask J2 is measured for each of the plurality of areas ER of the main surface J11 of the target layer J1 by the optical observation device OC of the processing system 1.

In step SB2 (the fourth step) subsequent to step SB1, a positive difference value obtained by subtracting a reference value of the groove width from the value of the groove width of the pattern of the mask J2 measured in step SB1 is calculated for each of the plurality of areas ER of the main surface J11 of the target layer J1.

In step SB3 subsequent to step SB2, it is determined whether the adjustment of the groove width of the pattern has been already once performed (the case where the adjustment of the groove width of the pattern has been already once performed is the case where the adjustment of the groove width of the pattern has been already once performed in steps SB5 to SB7, which will be described below), and when the adjustment of the groove width of the pattern has not been performed yet (when the adjustment of the groove width of the pattern is initially performed) (step SB3: No), the process proceeds to step SB5. In step SB3, when the adjustment of the groove width of the pattern has been already once performed (step SB3: Yes), the process proceeds to step SB4.

In step SB4, it is determined whether it is necessary to re-adjust the groove width of the pattern based on the difference value of the groove width of the pattern calculated in step SB2. In step SB4, when it is necessary to re-adjust the groove width of the pattern (step SB4: Yes), steps SB5 to SB7 are re-executed. That is, steps SB1 and SB2 are re-executed after steps SB5 to SB7 are executed, and when the difference value calculated in step SB2 does not satisfy a predetermined reference range due to the re-execution (step SB4: Yes), steps SB5 to SB7 are re-executed. The reference range is a range including the reference value of the groove width used in step SB2. In step SB4, when it is not necessary to re-adjust the groove width of the pattern (step SB4: No), that is, when the difference value calculated in step SB2 satisfies the predetermined reference range, the processing of step SAA is terminated.

In step SB5 subsequent to step SB3 (Yes) and step SB4 (Yes), the wafer W is shifted to the plasma processing apparatus 10 from the optical observation device OC by the transport robot Rb1 and the transport robot Rb2 and the wafer W is loaded into the processing container 12 of the plasma processing apparatus 10.

In step SB6 (the fifth step) subsequent to step SB5, a film J3 having a film thickness of the difference value of each of the plurality of areas ER calculated in step SB2 (a film in which a film thickness of each of the plurality of areas ER is the difference value calculated in step SB2 for each of the plurality of areas ER) is formed on a surface J21 of the mask J2 of the wafer W loaded into the processing container 12. The film J3 is a silicon oxide film. FIG. 6B is a cross-sectional view illustrating a state of the wafer W before the step illustrated in FIG. 5 (step SB6) is performed. In the wafer W illustrated in FIG. 6B, the film J3 is formed on the surface J21 of the mask J2. Further, the contents of the processing performed in step SB6 will be described in detail below.

In step SB7 subsequent to step SB6, the wafer W is shifted to the optical observation device OC from the plasma processing apparatus 10 by the transport robot Rb1 and the transport robot Rb2 and the wafer W is loaded into the optical observation device OC. After step SB7, steps SB1, SB2, and SB3 are re-executed.

Step SB6 will be described in detail with reference to FIGS. 8 and 9. FIG. 8 is a flowchart illustrating an example of the step of adjusting the groove width of the pattern, which is a part of the steps illustrated in FIG. 5 (step SB6). FIG. 9 is a flowchart illustrating an example of a step of forming a uniform film on the main surface J11 of the target layer J1, which is a step (step SCC) that may be included in the steps illustrated in FIG. 8.

As illustrated in FIG. 8, step SB6 includes steps SC1 to SC9. Steps SC5 to SC8 form sequence SQ1. Sequence SQ1 and step SC9 are film forming processing for forming the film J3 on the surface J21 of the mask J2 of the wafer W. Steps SC1 to SC4 are preparation processing required for executing the film forming processing constituted by sequence SQ1 and step SC9.

In step SC1, the wafer W loaded into the processing container 12 of the plasma processing apparatus 10 is aligned and provided on the electrostatic chuck ESC. In step SC2 subsequent to step SC1, similar to step SB3, it is determined whether the adjustment of the groove width of the pattern has been already once performed (the case where the adjustment of the groove width of the pattern has been already once performed is the case where the adjustment of the groove width of the pattern has been already once performed in steps SB5 to SB7, which is to be described below), and when the adjustment of the groove width of the pattern has not been performed yet (when the adjustment of the groove width of the pattern is initially performed) (step SC2: No), the process proceeds to step SC3. Further, the determination result of step SC2 corresponds to the determination result of step SB3 illustrated in FIG. 5. Further, there is a case where step SC3 is not executed when step SAA including step SC3 is performed in step SA2 of etching the organic film (step SAA is performed after step SA1 and before step SA21).

In step SC2, when the adjustment of the groove width of the pattern has been already once performed (step SC2: Yes), the process proceeds to step SC4 or step SCC (the twelfth step). Further, since the determination result of step SC2 is the same as the determination result of step SB3, the determination processing of step SC2 may be performed by referring to the determination result of step SB3.

In step SCC, the film is conformally formed on the surface J21 of the mask J2 regardless of the plurality of areas ER. Step SCC will be described in detail with reference to FIG. 9 below. Further, as illustrated in FIG. 8, step SB6 may be the configuration, which does not include step SCC, but when step SB6 includes step SCC, step SCC may be executed between step SC3 or step SC2 (No) and step SC4 (that is, before step SC4) or after step SC9 (Yes) (that is, after the film forming processing), which is to be described below.

Step SC3 subsequent to step SC2 (Yes), secondary electrons are emitted to the wafer W. Step SC3 is an step of emitting the secondary electrons to the mask J2 by generating plasma within the processing space Sp of the processing container 12 and applying a negative DC voltage to the upper electrode 30 before sequence SQ1 and step SC9 of forming the film J3 on the surface J21 of the mask J2 are executed.

As described above, before the series of processes of sequence SQ1 to step SC9 of forming the film J3 on the surface J21 of the mask J2 are executed, the secondary electrons are emitted to the mask J2, so that it is possible to reform the mask J2 before the film J3 is formed, thereby suppressing damage to the mask J2 due to the subsequent steps.

The contents of the processing of step SC3 will be described in detail. First, hydrogen gas and noble gas are supplied into the processing container 12, and high-frequency power is supplied from the first high frequency power supply 62, so that plasma is generated within the processing space Sp. Hydrogen gas and noble gas are supplied into the processing container 12 from the gas source selected from the plurality of gas sources of the gas source group 40. Accordingly, positive ions in the processing space Sp are drawn into the upper electrode 30, so that the positive ions collide with the upper electrode 30. The positive ions collide with the upper electrode 30, so that the secondary electrons are discharged from the upper electrode 30. The discharged secondary electrons are emitted to the wafer W, so that the mask J2 is reformed. Further, the positive ions collide with the electrode plate 34, so that silicon, which is the material forming the electrode plate 34, is discharged together with the secondary electrons. The discharged silicon is combined with oxygen discharged from the configuration component of the plasma processing apparatus 10 exposed to plasma. The oxygen is discharged from the member, for example, the support part 14, the insulating shielding member 32, and the deposit shield 46. A silicon oxide compound is generated by a combination of silicon and oxygen, and the silicon oxide compound is deposited on the wafer W and covers and protects the mask J2. As described above, in step SC3 of emitting the secondary electrons to the mask J2, the negative DC voltage is applied to the upper electrode 30 by generating plasma within the processing space Sp, so that the secondary electrons are emitted to the mask J2 and simultaneously silicon is discharged from the electrode plate 34 to cover the mask J2 with the silicon oxide compound including the silicon. Further, the secondary electrons are emitted to the mask J2, the mask J2 is covered with the silicon oxide compound, and then the inside of the processing container 12 is purged, and the process proceeds to step SC4 or step SCC. As described above, when the silicon oxide compound covers the mask J2 in step SC3, it is possible to further suppress damage to the mask J2 due to the subsequent steps.

Further, in step SC3, in order to reform the mask or form the protection film by the emission of the secondary electrons in step SC3, the discharge of silicon may be suppressed by minimizing the bias power of the second high frequency power supply 64. Further, in method MT, step SC3 may be excluded.

After step SC3 or step SC2 (No), the process proceeds to step SC4 (the tenth step) by going through step SCC or without going through step SCC. In step SC4, for each of the plurality of areas ER of the main surface J11 of the target layer J1 of the wafer W, a temperature of the target layer J1 of the wafer W is adjusted by using a temperature adjusting unit HT. In step SC4, the temperature of the target layer J1 is adjusted for each of the plurality of areas ER by using pre-acquired correspondence data DT indicating correspondence between the temperature of the target layer J1 and a film thickness of a film deposited on the surface J21 of the mask J2 on the target layer J1 (a film formed by the film forming processing (sequence SQ1 and step SC9), which will be described below), and the film thickness corresponding to the difference value calculated for each of the plurality of areas ER in step SB2. The correspondence data DT is pre-acquired data by depositing the film J3 on the surface J21 of the mask J2 based on the same condition as that of the film forming processing constituted by sequence SQ1 and step SC9 (the condition in which the temperature of the target layer J1 is excluded) for each temperature of the target layer J1, and is stored to be readable in the storage unit of the control unit Cnt.

In step SC4, when step SB6 does not include step SCC, the temperature of the target layer J1 is adjusted based on the correspondence data DT for each of the plurality of areas ER so that the temperature of each of the plurality of areas ER in the target layer J1 of the wafer W loaded into the processing container 12 becomes the temperature corresponding to the film thickness of the difference value calculated for each of the plurality of areas ER in step SB2.

In step SC4, when step SB6 includes step SCC, that is, step SCC is performed before step SC4, after step SC3, or after step SC2 (No), or step SCC is performed after the film forming processing constituted by step SQ1 and step SC9, the temperature of the target layer J1 is adjusted based on the correspondence data DT for each of the plurality of areas ER so that the temperature of each of the plurality of areas ER in the target layer J1 of the wafer W loaded into the processing container 12 becomes the temperature corresponding to the value obtained by subtracting a film thickness of the conformally formed film in step SCC from the film thickness of the difference value calculated for each of the plurality of areas ER in step SB2.

In the film forming processing (the eleventh step) constituted by step SQ1 and step SC9 subsequent to step SC4, the film (the film J3 or a part of the film J3 when step SCC is executed in step SB6) is formed on the surface J21 of the mask J2 on the target layer J1 of the wafer W loaded into the processing container 12. The film forming processing constituted by step SQ1 and step SC9 is the step of conformally forming the silicon oxide film on the surface J21 of the mask J2 of the wafer W with a uniform thickness for each of the plurality of areas ER by the same method as the atomic layer deposition (ALD) method. During the execution of step SC5 of sequence SQ1, the temperature of the target layer J1 of the wafer W adjusted for each of the plurality of areas ER in step SC4 is maintained. Because of this, the film formed by the film forming processing may have a different film thickness for each of the plurality of areas ER, but after the film J3 including the film formed by the film forming processing is formed on the surface J21 of the mask J2 (step SB4: No) and after step SAA, the groove width of the mask J2 has a desired value (the reference value of the groove width for each of the plurality of areas ER used for calculating the difference value in step SB2).

Figure 10A:
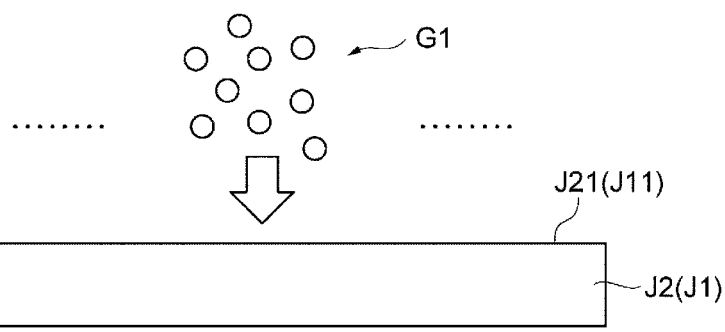
FIG. 10A is a diagram schematically illustrating a state of a target object before the sequence illustrated in each of FIGS. 8 and 9 is executed.

The film forming processing (sequence SQ1 and step SC9) will be described in detail. Sequence SQ1 includes steps SC5 to SC8. In step SC5 (the sixth step), first gas G1 is supplied into the processing container 12. Particularly, in step SC5, as illustrated in FIG. 10A, the first gas G1 containing silicon is introduced into the processing container 12. The first gas G1 includes organic contained aminosilane-based gas. The first gas G1 is aminosilane-based gas, and gas having a molecular structure with a relatively small number of amino groups may be used as the first gas G1, and for example, monoaminosilane ($H_3$—Si—R (R is an amino group, which may include an organic group and may be substituted) may be used. Further, the aminosilane-based gas used as the first gas G1 may include aminosilane, which may have one to three silicon atoms, or may include aminosilane having one to three amino groups. The aminosilane having one to three silicon atoms may be monosilane (monoaminosilane) having one to three amino groups, disilane having one to three amino groups, or trisilane having one to three amino groups. Further, the aminosilane may have an amino group which may be substituted. Further, the amino group may be substituted by any one of a methyl group, an ethyl group, a propyl group, and a butyl group. Further, the methyl group, the ethyl group, the propyl group, or the butyl group may be substituted by halogen. The first gas G1 of the organic group-containing aminosilane-based gas is supplied into the processing container 12 from the gas source selected from the plurality of gas sources of the gas source group 40. In step SC5, plasma of the first gas G1 is not generated.

A processing time required in step SC5 is within a time, in which the film thickness of the film deposited on the surface J21 of the mask J2 on the target layer J1 is in an increasing/decreasing state according to a high/low temperature of the target layer J1 in step SC5. The processing time may be a time shorter than a processing time (a processing time during which the film having the film thickness may be formed on the surface J21 of the mask J2 on the target layer J1 regardless of the temperature of the target layer J1), corresponding to a self-limited region in the ALD method.

Figure 10B:
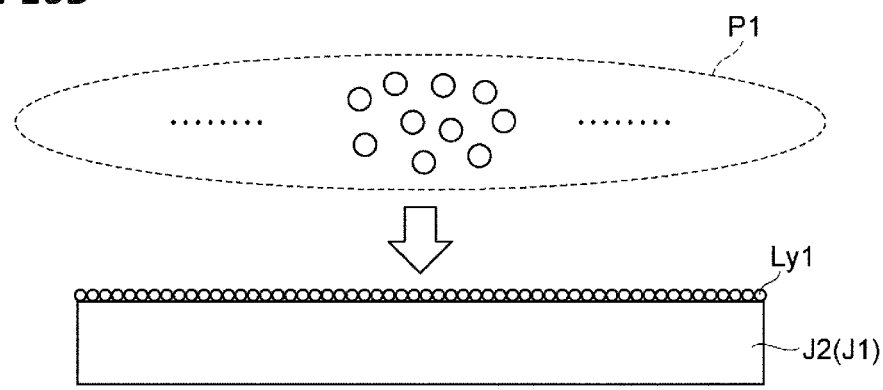
FIG. 10B is a diagram schematically illustrating a state of the target object during execution of the sequence illustrated in each of FIGS. 8 and 9, and FIG.

Molecules of the first gas G1 are attached to the main surface J11 of the target layer J1 (particularly, the surface J21 of the mask J2 on the main surface J11) as a reaction precursor (a layer Ly1) as illustrated in FIG. 10B. The molecules of the first gas G1 are attached to the surface J21 of the mask J2 by chemical adsorption based on a chemical combination, and plasma is not used. Further, as the first gas, gas G1, which is attachable to the surface J21 of the mask J2 by a chemical combination based on the temperature of the target layer J1 adjusted for each of the plurality of areas ER in step SC4 and also contains silicon, may be used.

In the meantime, for example, in the case where monoaminosilane is selected as the first gas G1, monoaminosilane is selected because monoaminosilane has relatively high electro negativity and chemical adsorption may be relatively easily performed due to a molecular structure having polarity. The layer Ly1 of the reaction precursor formed by the attachment of the molecules of the first gas G1 to the surface J21 of the mask J2 becomes a state close to a monomolecular layer (single layer) because the attachment is the chemical adsorption. As the amino group R of the monoaminosilane is smaller, the molecular structure of the molecule adsorbed to the surface J21 of the mask J2 becomes smaller, so that steric inhibition caused by a size of the molecule is reduced, and thus the molecules of the first gas G1 may be uniformly adsorbed to the surface J21 of the mask J2 for each of the plurality of areas ER and the layer Ly1 may be formed with the uniform film thickness for each of the plurality of areas ER for the surface J21 of the mask J2.

As described above, since the first gas G1 includes the organic group-containing aminosilane-based gas, the reaction precursor (the layer Ly1) of silicon is formed on the mask J2 along an atomic layer of the surface J21 of the mask J2 by step SC5.

In step SC6 (the seventh step) subsequent to step SC5, the inside of the processing container 12 is purged. Particularly, the first gas G1 supplied in step SC5 is exhausted. In step SC6, inert gas, such as nitrogen gas or noble gas (for example, Ar) may be supplied into the processing container 12 as purge gas. That is, the purge of step SC6 may be any one of gas purge, in which inert gas flows into the processing container 12 or purge by a vacuum state. In step SC6, the molecules excessively attached to the surface J21 of the mask J2 may be removed. By the steps, the layer Ly1 of the reaction precursor becomes a very thin monomolecular layer.

In step SC7 (the eighth step) subsequent to step SC6, as illustrated in FIG. 10B, plasma P1 of second gas is generated in the processing space Sp of the processing container 12. The second gas includes gas containing oxygen atoms and carbon atoms, and may include, for example, carbon dioxide gas. In step SC7, a temperature of the target layer J1 of the wafer W when the plasma P1 of the second gas is generated may be, for example, 0° C. or higher and 200° C. or lower. The second gas including a gas containing oxygen atoms and carbon atoms is supplied into the processing container 12 from the gas source selected from the plurality of gas sources of the gas source group 40. Further, high-frequency power is supplied from the first high frequency power supply 62. In this case, bias poser of the second high frequency power supply 64 may be applied, and plasma may also be generated only with the second high frequency power supply 64. A pressure of the space within the processing container 12 is set to a predetermined pressure by supplying high frequency bias power from the second high frequency power supply 64 and operating the exhaust device 50. As described above, the plasma P1 of the second gas is generated within the processing space Sp.

Figure 10C:
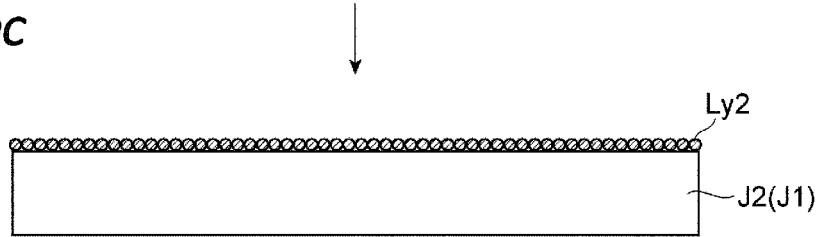

As illustrated in FIG. 10B, when the plasma P1 of the second gas is generated, active species of oxygen and active species of carbon, for example, oxygen radical and carbon radical, are generated, and as illustrated in FIG. 10C, a layer Ly2 (layer included in the film J3), which is a silicon oxide layer, is formed as a monomolecular layer. Since the carbon radical may exert a function of suppressing the mask J2 from being oxygen eroded, the silicon oxide film may be stably formed on the surface J21 of the mask J2 as a protection layer. Binding energy of Si—O bond of the silicon oxide layer is about 192 kcal, and is higher than binding energy (about 50 to 110 kcal, about 70 to 110 kcal, and 100 to 120 kcal) of C—C bond, C—H bond, and C—F bond, which are several bond species of the organic film forming the mask, so that the silicon oxide film may exert a function as the protection film.

As described above, since the second gas includes oxygen atoms, in step SC7, the oxygen atoms are bound to the reaction precursor (the layer Ly1) of silicon arranged on the mask J2, so that the layer Ly2 of the silicon oxide layer may be conformally formed with a different film thickness for each of the plurality of areas ER on the mask J2. Further, since the second gas includes carbon atoms, the erosion of the mask J2 due to the oxygen atoms may be suppressed by the carbon atoms. Accordingly, in sequence SQ1, by the same method as the ALD method, the layer Ly2 of the silicon oxide film may be conformally formed on the surface J21 of the mask J2 for each of the plurality of areas ER with the uniform film thickness according to the temperature of each of the plurality of areas ER.

In step SC8 (the ninth step) subsequent to step SC7, the inside of the processing container 12 is purged. Particularly, the second gas supplied in step SC7 is exhausted. In step SC8, inert gas, such as nitrogen gas or noble gas (for example, Ar) may be supplied into the processing container 12 as purge gas. That is, the purge of step SC8 may be any one of gas purge, in which inert gas flows into the processing container 12 or purge by a vacuum state.

In step SC9 subsequent to sequence SQ1, it is determined whether the number of times of the repetition of sequence SQ1 reaches a predetermined number of times (for example, 50 times), and when it is determined that the number of times of the repetition of sequence SQ1 does not reach the predetermined number of times (step SC9: No), sequence SQ1 is executed again, and when it is determined that the number of times of the repetition of sequence SQ1 reaches the predetermined number of times (step SC9: Yes), step SB6 is terminated. That is, in step SC9, by repeatedly executing sequence SQ1 until the number of times of the repetition of sequence SQ1 reaches the predetermined number of times, the film having the film thickness according to a temperature of each of the plurality of areas ER is formed on the surface J21 of the mask J2 for each of the plurality of areas. The number of times of the repetition of sequence SQ1 controlled by step SC9 is determined according to the processing time of step SC5 and the film thickness of the film (the film J3, or a part of the film J3 when step SCC is executed in step SB6) formed by the film forming processing constituted by sequence SQ1 and step SC9.

Herein, step SCC will be described in detail with reference to FIG. 9. Step SCC constituted by sequence SQ2 and step SD5. Sequence SQ2 constituted by steps SD1 to SD4. Step SD1 of sequence SQ2 corresponds to step SC5 of sequence SQ1 illustrated in FIG. 8, but step SD1 is different from step SC5 in that a temperature of the target layer J1 in step SD1 is different from the temperature of the target layer J1 in step SC5, and the processing time required in step SD1 is different from a processing time required in step SC5. In steps SD2 to SD4 of sequence SQ2, the same processing as that of steps SC6 to SC8 of sequence SQ1 illustrated in FIG. 8 is performed, respectively.

The number of times of the repetition of sequence SQ2 controlled by step SD5 is determined according to the film thickness of the film (the part of the film J3) formed by step SCC. The film J3 formed in step SB6 is formed of the film formed in step SCC and the film formed by the film forming processing (sequence SQ1 and step SC9). The film thickness of the film J3 formed in step SB6 is a sum value of the film thickness of the film formed in step SCC and the film thickness of the film formed by the film forming processing (sequence SQ1 and step SC9).

A processing time in step SD1 of sequence SQ2 is a processing time corresponding to a self-limited region (the processing time, in which the film having the film thickness may be formed on the surface J21 of the mask J2 on the target layer J1 regardless of the temperature of the target layer J1) in the ALD method, and is longer than the processing time of step SC5 of sequence SQ1. In step SD1, a temperature of the target layer J1 of the wafer W may be, for example, 0° C. or higher and 200° C. or longer.

A particular example of a method of writing the correspondence data DT according to an embodiment will be described. The correspondence data DT indicates correspondence between the temperature of the target layer J1 and the film thickness of the film (the film formed by the film forming processing (sequence SQ1 and step SC9) deposited on the surface J21 of the mask J2 on the target layer J1, and is data pre-acquired before the execution of method MT by depositing the film J3 on the surface 21 of the mask J2 based on the same condition (the condition, in which the temperature of the target layer J1 is executed) as that of the film forming processing constituted by sequence SQ1 and step SC9 for each temperature of the target layer J1.

First, for each of the plurality of temperatures (hereinafter, a value of the temperature is referred to as "KR") of the target layer J1, a relation (hereinafter, the relation is referred to as "F1" with a function of the processing time TM and the temperature KR) between the processing time in step SC5 (hereinafter, a value of the processing time is referred to as "TM") and the film thickness (hereinafter, a value of the film thickness is referred to as "VL") formed by the film forming processing is measured. For each of the temperatures KR, a relation VL (VL=F1(TM; KR)) of the processing time TM and the film thickness VL may be preferably approximated by the logarithm function VL=$\alpha$1(KR)×ln(TM)+$\beta$1(KR) (Equation 1). $\alpha$1(KR) is a constant determined for each KR, ln(TM) is a natural logarithm for TM, and $\beta$1(KR) is a constant determined for each KR. In Equation 1 (approximate expression), the film thickness VL of the film formed by the film forming processing is larger as when the temperature KR is higher as can be seen from the equation (Arrhenius plot) of Arrhenius for the temperature KR, but in the self-limited region of the ALD method, the film thickness VL of the film formed by the film forming processing converges to a nearly constant value, regardless of KR.

$\alpha$1(KR) and $\beta$1(KR) included in Equation 1 may be approximated as described below. A reciprocal (1/$\alpha$1(KR)) of $\alpha$1(KR) may be preferably approximated by a first function, 1/$\alpha$1(KR)=$\alpha$2×KR+$\beta$2 (Equation 2). $\alpha$2 and $\beta$2 are constants determined at the time of the calculation of Equation 2 (approximate expression). $\beta$1(KR) may be preferably approximated by a logarithm function, $\beta$1(KR)=$\alpha$3×ln(KR)+$\beta$3 (Equation 3) as a function of KR. $\alpha$3 and $\beta$3 are constants determined at the time of the calculation of Equation 3 (approximate expression). ln(KR) is a natural logarithm for KR.

Equations 2 and 3 are applied to $\alpha$1(KR) and $\beta$1(KR) included in Equation 1, respectively, so that Equation 1 is expressed by VL=ln(TM)/($\beta$2×KR+$\beta$2)+$\alpha$3×ln(KR)+$\beta$3 (Equation 4). That is, the film thickness VL may be uniquely calculated according to the temperature KR when the processing time TM is fixed with a constant value (the processing time required in step SC, which is shorter than the processing time corresponding to the self-limited region in the ALD method and the processing time, in which the film thickness VL is sufficiently changed by the temperature KR). As described above, the correspondence data DT may be written by Equation 4. Further, the correspondence data DT may also be written by a method, other than the method using Equations 1 to 4.

In method MT according to the embodiment, before step SA11 (or step SA21, step SA31, and step SA41) of etching the target layer J1, step SAA of adjusting the groove width of the pattern of the mask J2 is performed. In step SAA, the main surface J11 of the target layer J1 is divided into the plurality of areas ER, a difference value between the groove width of the mask J2 and the reference value of the groove width is calculated for each of the plurality of areas ER in steps SB1 and SB2, and the film J3 having the film thickness corresponding to the difference value is formed on the mask J2 in step SB6 to correct the groove width of the mask to the reference value for each of the plurality of areas ER. In step SB6, the film is very precisely formed on the mask J2 for every atom layer by the same method as the ALD method by using the film forming processing, in which steps SC5 to SC8 are repeatedly executed. The film thickness of the film formed by the film forming processing is different according to a temperature of the target layer J1, so that in step SC4, the temperature of the target layer J1 is adjusted so as to be the temperature required for forming the film having the film thickness corresponding to the difference value calculated in step SB2 for each of the plurality of areas ER by using the corresponding data DT indicating the correspondence between the temperature of the target layer J1 and the film thickness of the formed film. As described above, before the etching performed in step SA11 (or step SA21, step SA31, and step SA41), a film thickness corresponding to a correction amount of the groove of the mask J2 is determined for each of the plurality of areas ER of the main surface J11 of the target layer J1, a temperature of the target layer J1 required for forming the film thickness is determined by using the correspondence data DT, and the same film forming processing as the ALD method is performed in the state where the temperature of the target layer J1 is adjusted to the temperature determined for each of the plurality of areas ER, so that the variation of the pattern of the mask J2 may be precisely and sufficiently suppressed for each of the plurality of areas ER of the main surface J11 of the target layer J1.

Further, when step SCC of conformally forming the film on the surface J21 of the mask J2 regardless of the plurality of areas ER is used in method MT, for the common film thickness among the film thicknesses of the plural areas ER, it is possible to partially form the film by step SCC without adjusting the temperature of the target layer J1 performed on each of the plurality of areas ER in step SC4.

Further, after the film J3 is formed in step SB6, a difference value of the groove width of the mask J2 is calculated again and it is determined whether the difference value is within the reference range (steps SB1 to SB4), and when the difference value is not within the reference range, it is necessary to form the film J3 again, so that the variation of the groove width of the mask J2 may be more sufficiently suppressed.

In the foregoing, the embodiment has been described with the principle of the present disclosure, but those skilled in the art recognizes that the present disclosure may be changed in disposition and details without departing from the principle. The present disclosure is not limited to the specific configurations disclosed in the present embodiment. Accordingly, all modifications and changes in the claims and the scope of the spirit of the claims are claimed.

What is claimed is:

1. A method for processing a target object, the method comprising:
   a first step of adjusting a width of a mask pattern of a mask provided on a main surface of a target layer included in the target object, the main surface being divided into a plurality of areas;
   a second step of etching the target layer by using the mask after the first step,
   the first step includes:
      a third step of measuring the width of the mask pattern for each of the plurality of areas of the main surface,
      a fourth step of calculating a positive difference value obtained by subtracting a reference value of the width of the mask pattern from the width of the mask pattern measured in the third step for each of the plurality of areas of the main surface after the third step; and
      a fifth step of forming a film having a thickness of the positive difference value of each of the plurality of areas of the main surface calculated in the fourth step on a surface of the mask pattern of the target object introduced into a processing container of a plasma processing device after the fourth step,
   the fifth step includes:
      a sixth step of supplying first gas into the processing container;
      a seventh step of purging an inside of the processing container after the sixth step;
      an eighth step of generating plasma of second gas within the processing container after the seventh step;
      a ninth step of purging the inside of the processing container after the eighth step; and
      repeating the sixth step to ninth step thereby forming a film on a surface of the mask,
   wherein, in the fifth step, a temperature of the target layer of the target object introduced into the processing container is adjusted to an adjusted temperature for each of the plurality of areas by using pre-acquired correspondence data indicating correspondence between the adjusted temperature of the target layer thickness corresponding to the positive difference value calculated for each of the plurality of areas in the fourth step, and in the fifth step, the film having the thickness of the positive difference value of each of the plurality of areas is formed on the surface of the mask pattern of the target object; and
   a processing time required in the sixth step falls within a time period during which the film thickness of the film deposited on the surface of the mask on the target layer increases or decreases according to a temperature of the target layer in the sixth step.

2. The method according to claim 1, wherein the temperature of the target layer is adjusted based on the correspondence data for each of the plurality of areas such that a temperature of each of the plurality of areas in the target layer of the target object introduced into the processing container becomes a temperature corresponding to a film thickness of the difference value calculated for each of the plurality of areas in the fourth step.

3. The method according to claim 1, wherein in the fifth step the film on the surface of the mask is conformally formed regardless of the plurality of areas,
   the temperature of the target layer is adjusted based on the correspondence data for each of the plurality of areas such that a temperature of each of the plurality of areas in the target layer of the target object introduced into the processing container becomes a temperature corresponding to a value obtained by subtracting a film thickness of the film conformally formed from a film thickness of the difference value calculated for each of the plurality of areas, and
   adjusting the temperature of the layer based on the correspondence data for each of the plurality of areas is performed before or after the film forming processing begins.

4. The method according to claim 1, wherein the first step includes re-executing the third step and the fourth step after execution of the fifth step, and re-executing the fifth step when the re-execution of the third step and the fourth step does not cause a difference value calculated in the fourth step to satisfy a preset reference range.

5. The method according to claim 1, wherein the first gas includes an aminosilane-based gas, and the second gas includes a gas containing oxygen atoms and carbon atoms.

6. The method according to claim 5, wherein the first gas includes monoaminosilane.

7. The method according to claim 5, wherein the aminosilane-based gas of the first gas includes aminosilane having one to three silicon atoms.

8. The method according to claim 5, wherein the aminosilane-based gas of the first gas includes aminosilane having one to three amino groups.

9. A method for processing a target object, the method comprising:
   measuring a width of a mask pattern of a mask provided on a surface of a target layer included in a target object for each of a plurality of areas formed on the surface of the target layer;
   calculating a positive difference value obtained by subtracting a predetermined reference value from the measured width of the mask pattern for each of the plurality of areas;
   adjusting a temperature of the target layer for each of the plurality of areas to an adjusted temperature to enable forming of a film having a film thickness corresponding to the difference value by using pre-acquired correspondence data indicating correspondence between the adjusted temperature and the film thickness of the film having the film thickness corresponding to the difference value to be deposited on the surface of the mask on the target layer; and
   forming the film having the film thickness of the difference value for each of the plurality of areas on the surface of the mask of the target object by using an atomic layer deposition, after the adjusting to the adjusted temperature.

10. The method according to claim 9, wherein the forming is performed by repeatedly executing a sequence including:
   supplying a first gas into a processing container;
   purging an inside of the processing container; and generating plasma of a second gas within the processing container.

11. The method according to claim 10, wherein a time for supplying the first gas falls within a time period during which the film thickness of the film deposited on the surface of the mask increases or decreases according to an increase or decrease in temperature of the target layer.

12. The method according to claim 9, further comprising:
measuring a width of the mask pattern of the mask formed with the film after the forming for each of the plurality of areas; and
determining whether or not re-adjustment of the width is required.

13. The method according to claim 9, further comprising:
etching the target layer using the mask having a pattern width adjusted by the forming.

14. The method according to claim 13, wherein the adjusting of the temperature, the forming, and the etching are performed in a processing container without unloading the target object.

15. A method for processing a target object, the method comprising:
a first step of adjusting a width of a pattern of a first mask provided on a surface of a first film of a target layer of a target object;
a second step of etching the first film using the first mask after the first step to form a second mask;
a third step of adjusting a width of a pattern of the second mask; and
a fourth step of etching the target layer using the second mask the width of which is adjusted,
the first step includes:
measuring the width of the pattern of the first mask for each of a plurality of areas formed in the first film;
calculating a positive difference value obtained by subtracting a predetermined reference width from the measured value of the width for each of the plurality of areas;
adjusting a temperature of the target layer for each of the plurality of areas to an adjusted temperature to enable forming of a film having a film thickness corresponding to the difference value by using pre-acquired correspondence data indicating correspondence between the adjusted temperature and the film thickness of the film having the film thickness corresponding to the difference value to be deposited on the surface of the mask on the target layer; and
forming the film having the film thickness of the difference value for each of the plurality of areas on the surface of the mask of the target object by using an atomic layer deposition, after the adjusting to the adjusted temperature, and
the third step includes:
measuring the width of the pattern of the second mask for each of a plurality of areas;
calculating a positive difference value obtained by subtracting a predetermined reference width from the measured value of the width for each of the plurality of areas;
adjusting a temperature of the target layer for each of the plurality of areas to an adjusted temperature to enable forming of a film having a film thickness corresponding to the difference value by using pre-acquired correspondence data indicating correspondence between the adjusted temperature and the film thickness of the film having the film thickness corresponding to the difference value to be deposited on the surface of the second mask on the target layer; and
forming the film having the film thickness of the difference value for each of the plurality of areas on the surface of the mask of the target object by using an atomic layer deposition, after the adjusting to the adjusted temperature.

* * * * *